(12) United States Patent
Fuyuki et al.

(10) Patent No.: US 8,598,017 B2
(45) Date of Patent: Dec. 3, 2013

(54) FIBER SOI SUBSTRATE, SEMICONDUCTOR DEVICE USING THIS, AND MANUFACTURING METHOD THEREOF

(75) Inventors: Takashi Fuyuki, Tokyo (JP); Kenkichi Suzuki, Tokyo (JP); Sadayuki Toda, Tokyo (JP); Hisashi Koaizawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 13/614,512

(22) Filed: Sep. 13, 2012

(65) Prior Publication Data

US 2013/0023090 A1    Jan. 24, 2013

Related U.S. Application Data

(62) Division of application No. 11/718,302, filed as application No. PCT/JP2005/019779 on Oct. 27, 2005, now abandoned.

(30) Foreign Application Priority Data

Oct. 28, 2004    (JP) .................................. 2004-314882

(51) Int. Cl.
*H01L 21/20*    (2006.01)

(52) U.S. Cl.
USPC ..... 438/479; 438/486; 438/506; 257/E21.121

(58) Field of Classification Search
USPC .......................... 438/479, 486, 795, 137, 506
See application file for complete search history.

(56) References Cited

U.S. PATENT DOCUMENTS

| | | | |
|---|---|---|---|
| 8,029,327 B2* | 10/2011 | Suzuki et al. | 445/23 |
| 2004/0179767 A1 | 9/2004 | Arai et al. | |
| 2006/0257074 A1 | 11/2006 | Suzuki et al. | |

FOREIGN PATENT DOCUMENTS

| | | |
|---|---|---|
| JP | 2002-258775 | 9/2002 |
| JP | 2004 258206 | 9/2004 |
| JP | 2004 273817 | 9/2004 |

\* cited by examiner

*Primary Examiner* — Savitr Mulpuri
(74) *Attorney, Agent, or Firm* — Oblon, Spivak, McClelland, Maier & Neustadt, L.L.P.

(57) ABSTRACT

The present invention provides a SOI substrate that can realize a composite device formed of a MOS integrated circuit and a passive device and can reduce a size and a manufacturing cost of a semiconductor device. There is provided a fiber SOI substrate 5 comprising a fiber 1 with a polygonal cross section, and a semiconductor thin film 3 crystallized after film formation on at least one surface of the fiber 1, and a plurality of grooves 8 that extend in a linear direction of the fiber 1 and are arranged at intervals in a width direction are formed on a surface of the fiber 1.

3 Claims, 14 Drawing Sheets

FIG. 6A

| | | |
|---|---|---|
| ISLAND | 1 | PHOTO: Si ISLAND FORMATION |
| | 2 | ETCHING |
| | 3 | RESIST REMOVAL |
| (GATE OXIDE FILM SIDE SURFACE) | 4 | GATE OXIDE FILM DEPOSITION |
| Vth ADJUSTMENT | 5 | CHANNEL IMPLANTATION |
| | 6 | ANNEALING |
| GATE ELECTRODE | 7 | GATE ELECTRODE DEPOSITION |
| | 8 | PHOTO: GATE |
| | 9 | ETCHING |
| | 10 | RESIST REMOVAL |
| S/D | 11 | PHOTO |
| | 12 | N IMPLANTATION |
| | 13 | RESIST REMOVAL |
| | 14 | PHOTO: P |
| | 15 | P IMPLANTATION |
| | 16 | RESIST REMOVAL |
| | 17 | LASER ANNEALING |
| FIRST LAYER PAS/CONT | 18 | PAS $SiO_2$ DEPOSITION |
| | 19 | PHOTO: CONT |
| | 20 | ETCHING |
| | 21 | RESIST REMOVAL |
| S/D WIRING | 22 | BUFFER METAL DEPOSITION |
| | 23 | Al DEPOSITION |
| | 24 | CAP METAL DEPOSITION |
| | 25 | PHOTO: D WIRING |
| | 26 | ETCHING |
| | 27 | RESIST REMOVAL |
| SECOND LAYER PAS/CONT | 28 | SiN DEPOSITION |
| | 29 | $H_2$ ANNEALING |
| | 30 | PAS $SiO_2$ DEPOSITION |
| | 31 | PHOTO: TH |
| | 32 | ETCHING |
| | 33 | RESIST REMOVAL |
| SECOND LAYER WIRING | 34 | Al DEPOSITION |
| | 35 | CAP METAL DEPOSITION |
| | 36 | PHOTO: WIRING, PADDING |
| | 37 | ETCHING |
| | 38 | RESIST REMOVAL |

FIG. 6B

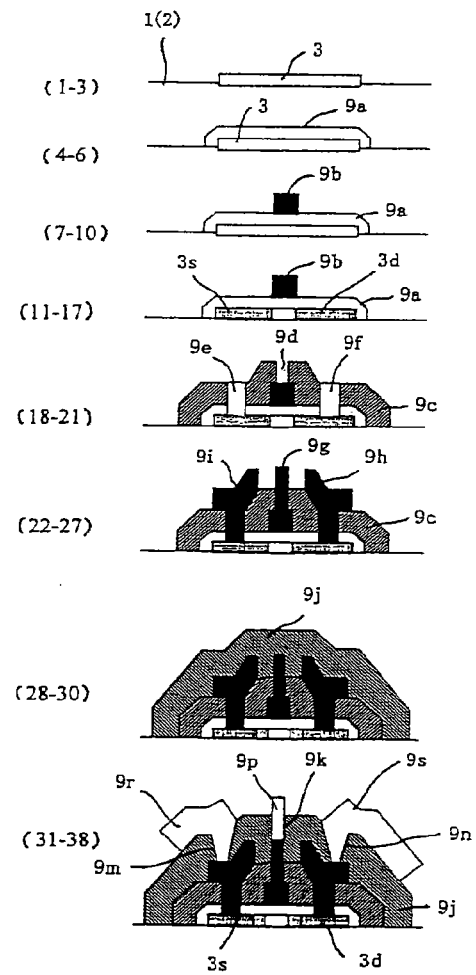

FIG. 7
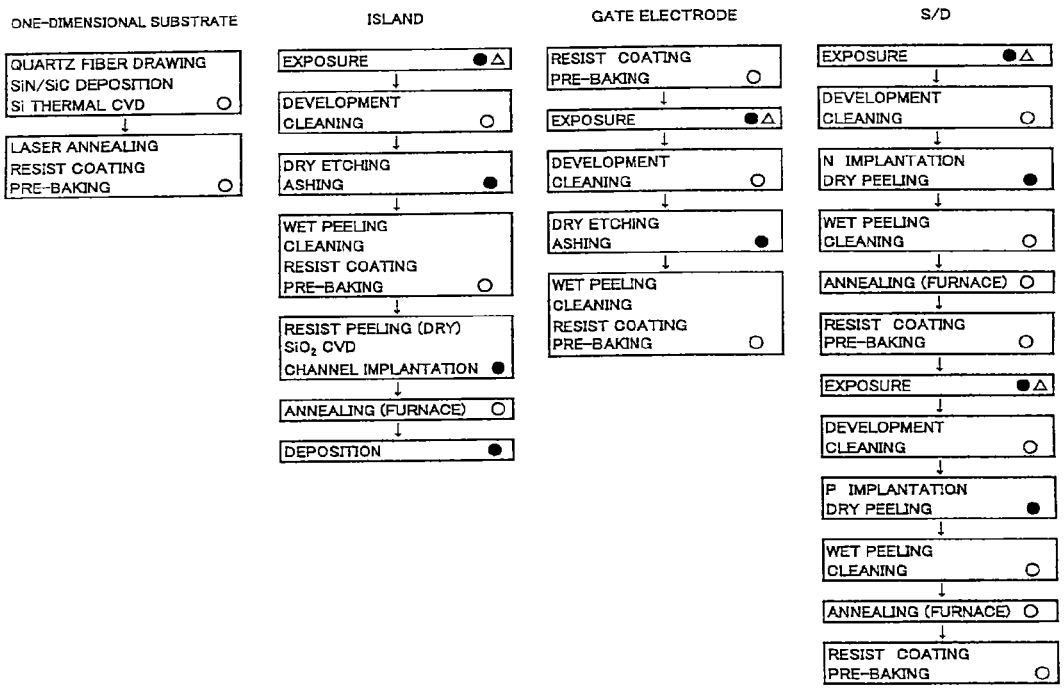
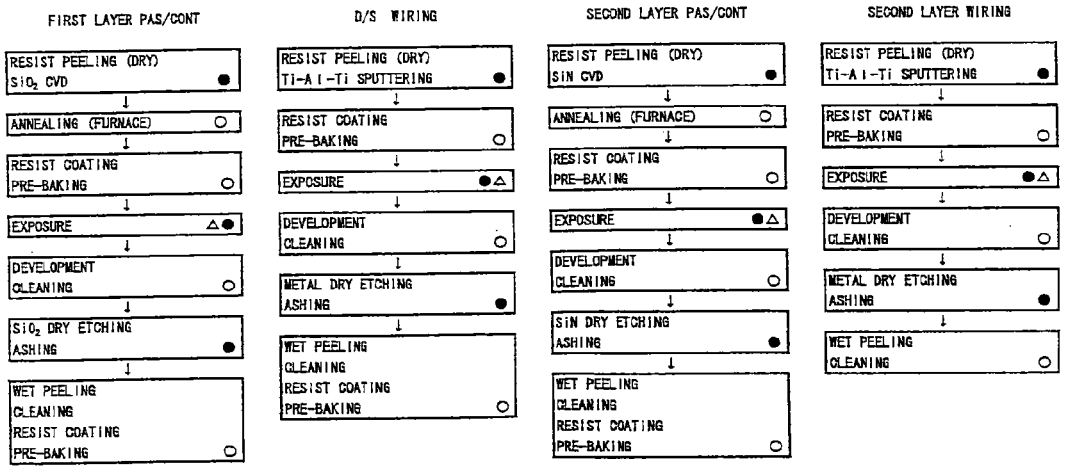

FIG. 12

| PROCESS | PLATE RATE | FIBER RATE | NECESSARY FILM THICKNESS | TIME/SINGLE FIBER |
|---|---|---|---|---|
| CVD SiN depo | 0.1 nm/s | 30 nm/s | 300 nm | 10 s |
| CVD SiO$_2$ depo | 1 nm/s | 30 nm/s | 300 nm | 10 s |
| steam oxidizing (1200°C) | 2 nm/s | 2 nm/s | 2 nm | 1 s |
| ion plating (metal) | 150 nm/s | 3.6 μm/s | 0.3~1 μm | 0.1~0.3 s |
| dry etching (RIE) | 10 nm/s | 100 nm/s | 300 nm~1 μm | 3~10 s |
| ACTIVATION ANNEALING (950°C) | | | | 1200 s |
| HYDROGEN ANNEALING (400°C) | | | | 3600 s |

FIBER SOI SUBSTRATE, SEMICONDUCTOR DEVICE USING THIS, AND MANUFACTURING METHOD THEREOF

CROSS REFERENCE

This application is a division of and is based upon and claims the benefit of priority under 35 U.S.C. §120 for U.S. Ser. No. 11/718,302, filed Jul. 21, 2008, the entire contents of which are incorporated herein by reference. U.S. Ser. No. 11/718,302 is a National Stage of PCT/JP05/19779; filed Oct. 27, 2005, and claims the benefit of priority under 35 U.S.C. §119 from Japanese Patent Application No. 2004-314882, filed Oct. 28, 2004.

FIELD OF THE INVENTION

The present invention relates to a fiber SOI substrate, a semiconductor device using this, and a manufacturing method thereof, and more particularly to a fiber SOI substrate using a quartz fiber, a semiconductor device formed by using this fiber SOI substrate, and a manufacturing method thereof.

BACKGROUND OF THE INVENTION

There are various kinds of semiconductor products, and innumerable usage patterns are present in all fields. Among others, what has a great ratio is, e.g., a microprocessor (MPU (Micro Processing Unit)) constituted of a MOS (Metal Oxide Semiconductor) transistor, a micro-controller unit (MCU), logic, or a memory. These semiconductor products are mainly applied to a computer, and expansion of this marketplace is greatly dependent on downsizing of a large-scale computing machine to a personal computer, i.e., development of an integrated circuit technology and a reduction in cost.

An improvement in performance and a reduction in cost of a semiconductor product have been achieved in accordance with miniaturization and an increase in a silicon (Si) wafer size, but an increase in size of each device and realization of high performance thereby raise an equipment investment. This increase in equipment cost also raises a product development cost as well as a manufacturing cost, resulting in a circle that is further miniaturization and an increase in a substrate size.

Further, as recent explosive spread and development of mobile phones, a ubiquitous society where a ubiquitous wireless network is provided is to be realized. This is considered as a system in which a terminal integrated circuit chip is embedded in every thing and terminal access system is wirelessly connected with a server through the Internet. A technology required in such a system is further miniaturization and a reduction in power of an existing MOS integrated circuit since a server and a communication system have a high speed and a high capacity. On the other hand, a requirement with respect to a final terminal is downsizing and a reduction in cost.

A CMOS (Complementary Metal Oxide Semiconductor) integrated circuit technology has continued proportional scaling down with a fixed voltage in a period from 1980 to 1995, and a power consumption has consequently quadrupled every year in a 3-year period. Although a power supply voltage has been reduced to suppress this increase, an actual situation is that a good effect cannot be obtained due to miniaturization and high integration.

Besides a reduction in voltage, a reduction in a threshold value of an active device is present as a method of suppressing a power consumption, but this method increases a leak current. These methods are based on fundamental principles of a MOS structure using a Si wafer and, after all, an only solution lies in an architecture, a circuit configuration, and a device operation design.

On the other hand, in a final terminal as typified by an IC tag, an IC section has a relatively simple circuit configuration, but requires a relatively large passive device, e.g., an antenna, an inductor, or a capacitor.

However, when creating a high-frequency passive element of 800 MHz to 5 GHz on a Si wafer, since a silicon substrate has a low resistance, an inductor or the like is coupled with the silicon substrate to reduce Q (quality factor). In case of forming a large capacitor in particular, when the capacitor is to have an on-chip structure, selection of a material becomes difficult, and hence the capacitor is formed on a print-circuit board. As a result, a print-circuit board (PCB) mounting cost is required, and hence a reduction in cost that is a primary requirement of, e.g., an IC tag is difficult.

It is known that most of the above-explained problems can be solved by using a SOI (semiconductor on insulator) substrate. In regard to MOS transistor characteristics, using a fully depleted SOI substrate enables realization of excellent characteristics. Further, using the SOI substrate enables taking various countermeasures for demerits, e.g., a self-heating effect, a substrate floating effect, or a device withstand voltage, and a high-speed logic circuit or a DRAM (dynamic random access memory) is manufactured by way of trial as disclosed in the following Patent Document 1. In a SOI substrate, since an insulating substrate is provided below a semiconductor layer, a high-performance passive device can be also readily formed on a chip.

[Patent Document 1] Japanese Patent Application Publication No. 2004-228206

DISCLOSURE OF INVENTION

Problem to be Solved by the Invention

However, a problem in a SOI substrate is a substrate manufacturing cost, and this cost is higher than that of a current wafer by more than a single order. That is because a SOI substrate manufacturing method requires various kinds of steps in order to provide an insulating substrate by using a Si wafer. Therefore, although it is known that a semiconductor device using a SOI substrate has the above-explained effectiveness, it will be a long time before this semiconductor device is put to practical use.

It is an object of the present invention to provide a fiber SOI substrate that enables formation of various kinds of MOS semiconductor devices and, in particular, a composite device of a MOS integrated circuit and a passive device, and that can reduce a size and a manufacturing cost of a semiconductor device as compared with a conventional two-dimensional substrate, and also provide a semiconductor device using this fiber SOI substrate and a manufacturing method thereof.

Means for Solving Problem

To solve the above-explained problem, according to a first aspect of the present invention, there is provided a fiber SOI substrate comprising: a fiber having a polygonal cross section; and a semiconductor thin film crystallized after film formation on at least one surface of the fiber.

In the fiber SOI substrate according to the first aspect, a second aspect of the present invention is characterized in that the semiconductor thin film is formed on a plurality of grooves that extend in a linear direction of the fiber on the surface of the fiber and are arranged at intervals in a width direction.

In the fiber SOI substrate according to the first or the second aspect, a third aspect of the present invention is characterized by further comprising a thin film formed of one of an insulating material and a semiconductor formed between the fiber and the semiconductor thin film.

In the fiber SOI substrate according to the first to the third aspects, a fourth aspect of the present invention is characterized in that an insulating film is formed on the semiconductor thin film.

According to a fifth aspect of the present invention, there is provided a semiconductor device comprising: a fiber SOI substrate comprising a semiconductor thin film crystallized after film formation on a fiber having a polygonal cross section; a semiconductor active device formed on the semiconductor thin film on at least one surface of the fiber; and a passive device formed on any surface of the fiber.

In the semiconductor device according to the fifth aspect, a sixth aspect of the present invention is characterized in that a circuit chip is connected with at least one surface of the fiber.

In the semiconductor device according to the fifth or the sixth aspect, a seventh aspect of the present invention is characterized in that the passive device is at least one of an inductor and a capacitor.

According to an eighth aspect of the present invention, there is provided a manufacturing method of a fiber SOI substrate comprising: a step of forming an amorphous, microcrystal, or polycrystal semiconductor thin film on at least one surface of a fiber having a polygonal cross section; and a step of crystallizing the semiconductor thin film by using one of a thermal annealing and a laser annealing.

In the eighth aspect, a ninth aspect of the present invention is characterized by further comprising a step of forming on the surface of the fiber a plurality of grooves that extend in a linear direction of the fiber and are arranged at intervals in a width direction before forming the semiconductor thin film.

In the manufacturing method of a fiber SOI substrate according to the ninth aspect, a 10th aspect of the present invention is characterized by further comprising: a step of previously forming a plurality of initial grooves on a surface of a base material that is used to form the fiber; and a step of forming the fiber by fiber drawing of the base material and, at the same time, narrowing the initial grooves of the fiber to have a predetermined width, thereby providing the grooves of the fiber.

In the manufacturing method of a fiber SOI substrate according to the ninth or the 10th aspect, an 11th aspect of the present invention is characterized by comprising a step of forming an insulative or semiconductor thin film on the surface of the fiber comprising the grooves before crystallizing the semiconductor thin film.

In the manufacturing method of a fiber SOI substrate according to one of the eighth to the 11th aspects, a 12th aspect of the present invention is characterized by further comprising a step of forming a silicon dioxide film on the semiconductor thin film after crystallizing the semiconductor thin film.

In the manufacturing method of a fiber SOI substrate according to the 12th aspect, a 13th aspect of the present invention is characterized in that the step of forming the silicon dioxide film is a step of forming a thermally oxidized film in a thermal oxidation furnace, continuously forming a film of a vapor-phase grown silicon dioxide, and annealing the film at a high temperature.

According to a 14th aspect of the present invention, there is provided a manufacturing method of a semiconductor device comprising: preparing a fiber SOI substrate comprising a semiconductor thin film crystallized after film formation on at least one surface of a fiber having a polygonal cross section; a step of forming an active device on the semiconductor thin film on at least one surface of the fiber SOI substrate; and a step of forming a passive device on any surface of the fiber.

In the manufacturing method of a semiconductor device according to the 14th aspect, a 15th aspect of the present invention is characterized by further comprising a step of connecting a circuit chip to at least one surface of the fiber SOI substrate.

According to a 16th aspect of the present invention, there is provided a manufacturing method of a semiconductor device, comprising: taking up a fiber SOI substrate around a first reel in a state where the fiber SOI substrate comprising a semiconductor thin film on at least one surface of a fiber having a polygonal cross section is covered with a protection film, and taking up the fiber SOI substrate around a second reel, the fiber SOI substrate being covered with the protection film or a new protection film after effecting processing of manufacturing a semiconductor device on the fiber SOI substrate in a region where the fiber SOI substrate is wound off from the first reel.

In the manufacturing method of a semiconductor device according to the 16th aspect, a 17th aspect of the present invention is characterized in that the protection film is a resist, and the processing is at least one of resist peeling, cleaning, drying, film formation, resist application, pre-baking, exposure, development, and etching.

Effect of the Invention

According to the present invention, crystallization of a semiconductor thin film formed on a fiber having a polygonal cross-sectional shape can realize a "one-dimensional" SOI substrate at a low cost, and using this substrate enables forming a composite device comprising an active device and a passive device mounted thereon, thereby reducing a cost of each of the SOI substrate, a manufacturing process, and a manufacturing device.

Here, the "one-dimensional" SOI substrate means a SOI substrate having a sufficient length that is, e.g., 10-fold of that of a dimension in a cross section, e.g., a width, a thickness, or a diameter.

Furthermore, since a region where the fiber SOI substrate is wound off or taken up by using two reels is determined as a processing region for formation of a semiconductor device, each surface of the fiber can be exposed to be processed, thereby realizing both a reduction in cost of, e.g., a MOS integrated circuit manufactured based on such a structure or a composite device comprising the MOS integrated circuit and a passive device and a reduction in device size with a three-dimensional layout utilizing four surfaces of the fiber.

BRIEF DESCRIPTION OF THE DRAWINGS

FIG. 6A is a flowchart of a forming step of a MOS transistor that is formed on a fiber SOI substrate according to the embodiment of the present invention, and FIG. 6B is a cross-sectional view showing the forming step of the MOS transistor according to the embodiment of the present invention;

FIG. 7 is a view showing a process flow obtained by dividing formation of the MOS transistor using the fiber SOI substrate by a reel-to-reel step in the embodiment according to the present invention;

FIG. 12 is a table showing a process rate of each step in the embodiment according to the present invention;

DESCRIPTION OF REFERENCE NUMERALS

Figure 1A:
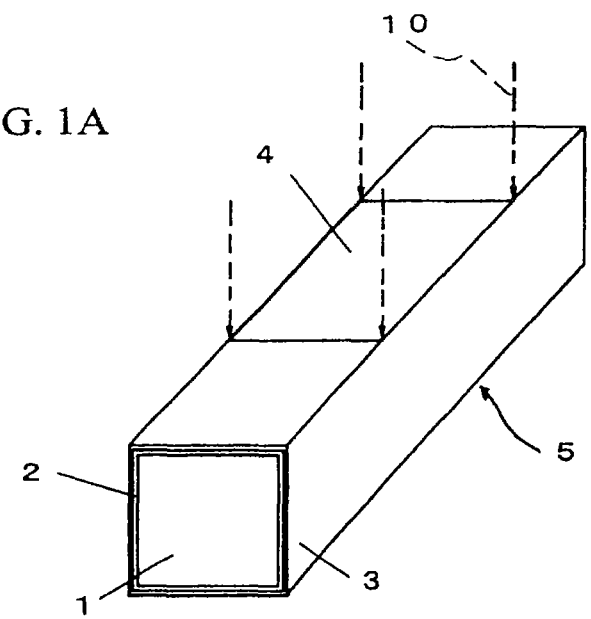
FIGS. 1A and 1B are a perspective view showing a method of single-crystallization based on laser annealing crystallization of a Si film formed on an angular fiber according to an embodiment of the present invention, and a view schematically showing an aspect of crystallization.

1: fiber
2: underlying film
3: silicon thin film
4: laser irradiating section
5: fiber SOI substrate
6: base material
7: groove of a base material
8, 8': groove of a fiber
10: laser beam
11: temperature adjuster
12: temperature adjustment medium
20a, 20b: antenna (inductor)
21: capacitor
25, 26, 27: integrated circuit
30a: wind-off reel
30b: take-up reel
31a to 31d: auxiliary reel
32 to 36: various kinds of process devices other than a vacuum tank
40a: wind-off reel
40b: take-up reel
40a, 40: vacuum tank
42a to 42c: differential exhaust chamber, or dry peeling chamber, or ashing chamber
43: process chamber
44: constituent component
50: exposure optical system
51: image forming lens
52: exposure mask
53: Koehler illumination optical system
55: servo control computer
56: image forming lens control system
57: detection system
58: fiber control system
60 to 62: fiber surface position detecting optical system
66a, 66b, 67a, 67b: fiber servo mechanical control system
70a: wind-off reel
70b: take-up reel
80: laser beam
81a, 81b: split lens
82: incoherence forming section
83: condenser lens
84: field lens
85: exposure mask
86: image forming lens
87: image forming plane
88a, 88b: fiber incidence/exit lens
89: optical path difference optical fiber
90: film forming chamber
91: heater
92a, 92b: gas introducing opening
93a, 93b: exhaust opening
100: dry etching chamber
101a, 101b: gas introducing opening
102a, 102b: exhaust opening
103, 104: linear electrode
105, 106: high-frequency power supply
107, 108: electric field
110: resist coating section
111: baking furnace
112: liquid tank
113: bypass section
114: exit

BEST MODE(S) FOR CARRYING OUT THE INVENTION

A SOI substrate according to an embodiment of the present invention has, e.g., the following three conformations.

A first conformation of the SOI substrate is obtained by forming an amorphous, micro-crystal, or polycrystal silicon (Si) thin film having a thickness of 100 nm or below on a quartz fiber having a square or rectangular cross section, or at least a part of a surface of the quartz fiber comprising a thin film of a silicon nitride ($Si_3N_4$) as an insulating material or a silicon carbide (SiC) as a semiconductor formed thereon, or one side of the quartz fiber as seen from a cross section thereof, and subjecting this structure to lateral growth crystallization in a linear direction of the fiber based on a thermal or a laser annealing.

A second conformation of the SOI substrate is obtained by forming on at least a part of a quartz fiber having a square or rectangular cross section or one side of the same as seen from the cross section fine grooves whose gap is several μm (micron meter) or below in a linear direction of the quartz fiber, forming a thin film of a silicon nitride or a silicon carbide on a surface of the grooves or on the grooves, further forming a film of an amorphous, micro-crystal, or polycrystal Si thin film having a film thickness of 100 nm or below on a surface of the silicon nitride or carbide thin film, and subjecting this structure to lateral growth crystallization in the linear direction of the fiber based on a thermal or a laser annealing.

A third conformation of the SOI substrate is obtained by forming a gate oxide film on an entire surface of the SOI substrate based on a thermal oxidation to provide convenience in formation of a MOS device, and forming a film of a silicon dioxide ($SiO_2$) at a high temperature after a thermal oxidation depending on a thickness of the gate oxide film.

As a semiconductor device structure using the above-explained SOI substrate, for example, the following three conformations can be applied.

A first structure is obtained by forming on at least a part of a quartz fiber or one side of the same as seen from a cross-sectional surface one or more MOS ICs, and wiring and passive devices, e.g., inductors or capacitors that are provided at any positions on the quartz fiber and used in combination with the MOS ICs. This passive device can be formed at a part that is equal to or different from the MOS IC, a side (surface) that is the same as the MOS IC, or a side (surface) that is different from the MOS IC.

A second structure is obtained by mounting an IC chip manufactured from, e.g., a different Si wafer on the first structure to be used.

A third structure is obtained by forming wiring and passive devices, e.g., inductors, capacitors, or resistances on a fiber and mounting an IC chip produced from, e.g., a different Si wafer thereon.

Next, as a method of manufacturing these semiconductor devices, for example, a reel-to-reel method is proposed. This is a method targeting a single long fiber, and it is a method that uses a fiber wound around a reel as a starting point and carries out one photolithography step based on a reel-to-reel scheme. That is, with a reel take-up state being determined as a starting point before resist peeling in a previous photolithography step, resist peeling, cleaning, and drying are carried out, a photo step is advanced in the order of, e.g., film formation, resist application, pre-baking, exposure, development, etching, and cleaning, the process is stopped before resist peeling to effect reel take-up, this is supplied to the next step, and the same process is thereafter repeated.

An embodiment according to the present invention will now be explained hereinafter with reference to the accompanying drawings.

As shown in FIG. 1A, an insulative thin film 2 made of a silicon nitride or a silicon carbide is formed as an underlying film on an entire surface of a quartz fiber 1 having an angular cross section or a part of the surface of the fiber 1, a polycrystal silicon film 3 having a thickness of 100 nm is formed on all or part of a surface of the insulative thin film 2 by a thermal CVD (chemical vapor deposition) method using a silicon tetrachloride ($SiCl_4$), and a region 4 on one surface of the silicon film 3 is uniformly irradiated with a beam from an XeCl pulse excimer laser 10 with a wavelength of 308 nm and a pulse width of 20 ns, thereby melting and crystallizing the silicon film 3. Such a fiber 1, the insulative thin film 2 and the silicon (semiconductor) film 3 formed on the fiber 1 constitute a fiber SOI substrate 5.

In a process of crystallization, a role of the silicon nitride or silicon carbide thin film 2 is an improvement in wettability of a silicon melt and consequently passivation of an interface between the substrate and the Si crystal.

Figure 1B:
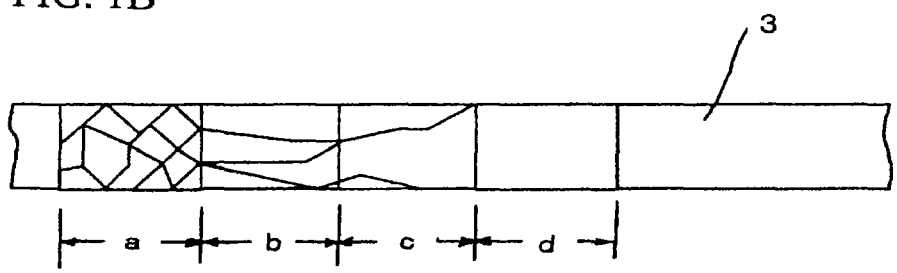

Here, a laser irradiating position is fixed, and the fiber 1 is moved in a longitudinal direction at a fixed speed. As shown in FIG. 1B, as to the process of crystallization, a first region "a" to which the laser beam is applied is formed of polycrystal. Furthermore, a laser pulse application timing is synchronized with movement of the quartz fiber 1, and a subsequent laser beam is applied to slightly overlap a part of the polycrystal Si film 3 that has been crystallized by laser irradiation. When this operation is repeated for several times, each crystal grain is gradually increased in the order of regions "b" and "c", and single-crystallization is finally realized like a region "d".

Although such a crystal growth method is a result of energetically effecting studies on laser annealing from the end of 1970's to the first half of 1980's and is well known, it is disclosed as ACSLG (Artificially controlled super lateral growth) in U.S. Patent No. 96/07730 (WO 97/45828) by James S. Im et al. According to the method disclosed by Im et al., a slit-like excimer laser beam is applied to a general "two-dimensional" substrate like the above explanation to achieve an increase in a particle diameter, but the particle diameter is just a several μ (micron) size, and further control is not carried out. That is, a degree of freedom in a crystal growth direction is high with occurrence of a nucleus in the regular two-dimensional substrate, and controlling this is very difficult.

Figure 2A:
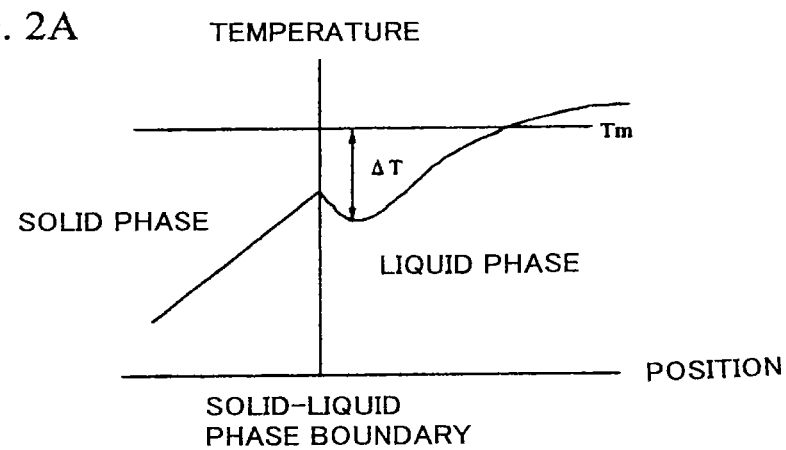
FIGS. 2A and 2B are characteristic views showing a principle of crystallization from a melt phase applied to the embodiment according to the present invention.

A flow of heat from a liquid phase to a solid phase is required to achieve crystallization from a silicon melt, and FIG. 2A schematically shows this status. A temperature of a liquid phase must be not greater than a melting point (Tm), namely, it must be in a supercooled state near a solid-liquid interface. A temperature increases on the solid-liquid interface due to latent heat of transition from the liquid phase to the solid phase. A temperature gradient that is sufficient to transfer heat must be formed in the solid phase.

Figure 2B:
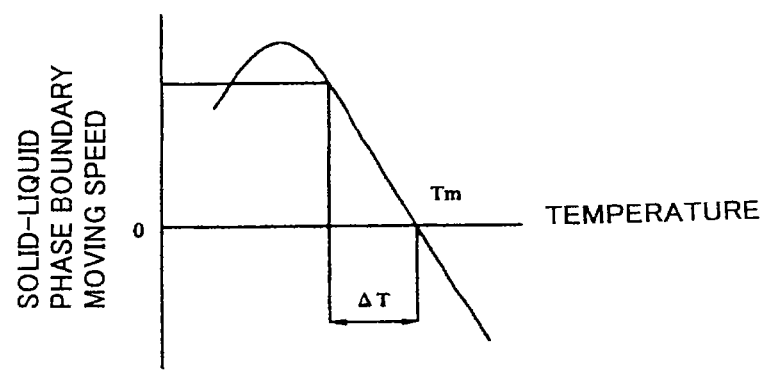

A growth speed of the solid phase is a function of supercooling ($\Delta T$) as indicated by an interface response function in FIG. 2B. A heat injection amount by the laser and a temperature gradient of a solid-phase silicon film determine this supercooling. These two elements determine a cooling speed, and the cooling speed is logarithmically in proportion to a crystal growth speed.

Figure 2C:
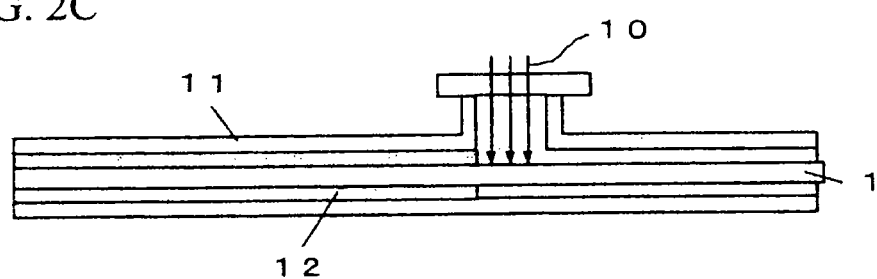
FIG. 2C is a block diagram of a device according to the embodiment of the present invention showing a method of applying this principle to the fiber.

When using a "one-dimensional" substrate like the quartz fiber 1, as shown in FIG. 2C, since a temperature adjuster 11 and a temperature adjustment medium 12, e.g., a cooling medium can accurately control an arbitrary part of the quartz fiber 1 as the substrate to an arbitrary temperature, the injection heat amount of the laser and the temperature gradient as an external parameter of crystal growth can be completely controlled. Therefore, when the "one-dimensional" substrate is used, this controllability acquires contents essentially different from those of the patent by Im et al.

In crystal growth, a thermal process and control over a crystal orientation are important. In particular, when using the "one-dimensional" substrate, although a crystallized region is restricted as compared with a regular two-dimensional substrate like a wafer, a width of the quartz fiber 1 that is considered to be put to practical use this time is 200 μm or above, a growth of a seed crystal that is at least 200 μm or above must be achieved, and this crystal must be grown to have a length of at least several mm or above.

Figures 3A, 3B, 3C:
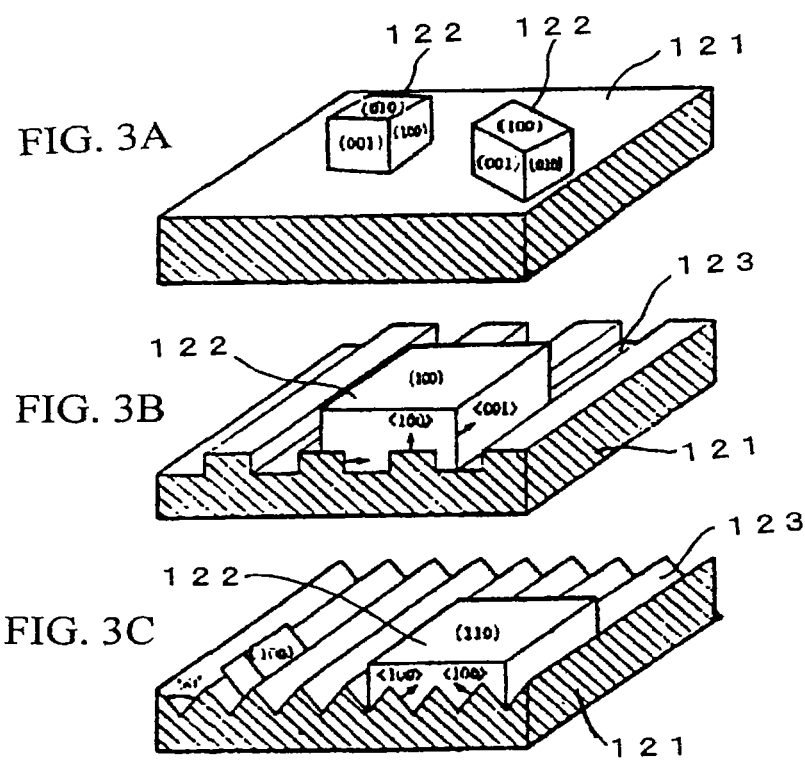
FIGS. 3A to 3C are views showing a principle of graphoepitaxy.

As a specific control method of single-crystallization with a large area, there is a grapho-epitaxial method (1979 IEDM No. 9, 1) reported by M. W. Geis et al. in 1979. As shown in FIG. 3A, alignments of crystals 122 around an axis vertical to a substrate 121 are usually random, but a crystal orientation can be restricted like an alignment of a liquid crystal molecule when fine grooves 123 are provided on the substrate 121 as shown in FIGS. 3B and 3C. As a result, they can obtain a silicon single crystal having a film thickness of 0.5 μm and a size of 15 mm square on a quartz substrate.

Figure 4A:
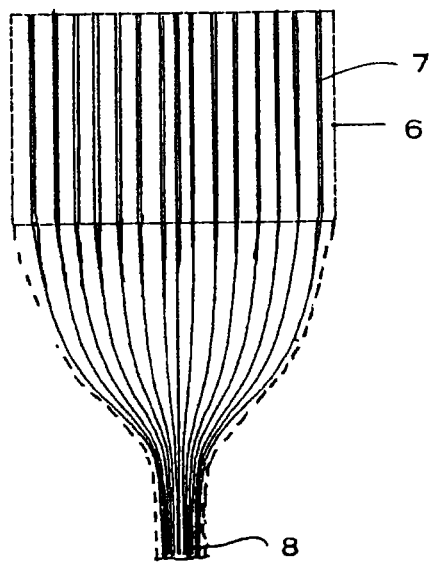
FIG. 4A is a side view showing a state of subjecting a base material to fiber drawing to form a fiber.
Figure 4B:
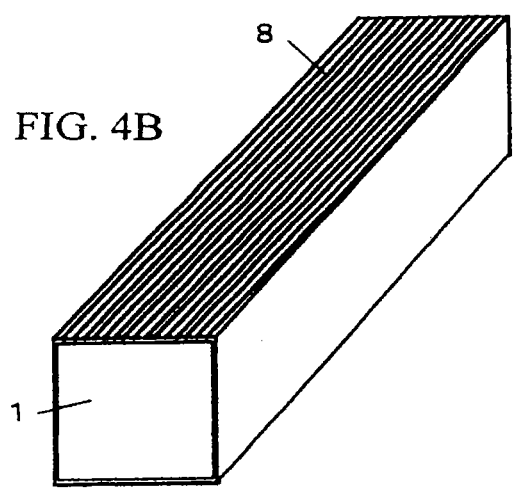
FIG. 4B is a perspective view showing the fiber according to the embodiment of the present invention.

Although the same principle is applied in the present invention, as a method of forming grooves in this example, as shown in FIG. 4A, grooves 7 are previously formed in a base material 6 that is used in fiber drawing to form the quartz fiber 1, this base material 6 is subjected to fiber drawing to be realized as a fiber, and the similarly miniaturized grooves 7 can be consequently formed on the surface of the fiber 1, as shown in FIG. 4B.

Figure 4C:
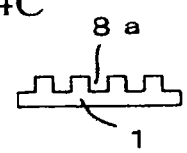
FIGS. 4C and 4D are cross-sectional views showing fine grooves on a fiber surface according to the embodiment of the present invention.
Figure 4D:
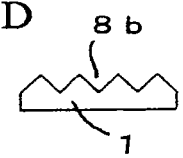

For example, if the grooves 7 each having a width of 1 mm are formed in a fiber-drawing direction on the angular base material 6 each side of which is 100 mm, a width of each groove 7 becomes 3 μm on the fiber surface having each side of 0.3 mm on the fiber surface when the base material 6 is subjected to fiber drawing. As a shape of the groove 7, it is possible to form such a groove 8a having a square cross section as shown in FIG. 4C, a groove 8b having a triangular cross section, or other arbitrary shapes as shown in FIG. 4D. Besides, a method of irradiating the completed fiber with a laser interference pattern or a mechanical method using a fine protrusion based on, e.g., super-steel can be adopted. An underlying film of a silicon nitride or a silicon carbide is formed on a pattern of such grooves 8 in some cases.

Further, the silicon thin film 3 is formed on the surface of the fiber 1 comprising such grooves 7 formed thereon, then the silicon thin film 3 is irradiated with a beam of such a pulse laser as shown in FIG. 1A, this allows the thin film to be changed into a crystal silicon thin film with a uniform crystal orientation, and the obtained structure can be used as the fiber SOI substrate 5.

In this embodiment, the XeCl excimer laser 10 is used, but the same effect can be obtained when a KrF excimer laser is used. A continuous oscillation YAG laser triple higher harmonic wave (a wavelength 353 nm) may be pulsed by using an EO modulator (an electro-optic modulator). Furthermore, a continuous oscillation laser may be used in association with a linear velocity and a cooling speed of the fiber.

The base material 6 shown in FIG. 4A is heated in a fiber-drawing furnace, hooked on a capstan, and subjected to fiber drawing at a predetermined speed, thereby providing the fiber 1. Moreover, the silicon film is formed on the surface of the fiber 1 in a region between the fiber-drawing furnace and the capstan. As a method of forming the silicon film, there is, e.g., a later-explained a thermal CVD method, a method of performing sintering after silicon paste application, or a method of effecting annealing after molten silicon application.

All semiconductor devices, e.g., a DRAM or a flash memory can be manufactured by using the fiber SOI substrate 5, but the fiber SOI substrate 5 is applied to an IC tag as an example of an active-passive composite device in which an effect prominently appears in this embodiment, and this example will be explained hereinafter.

Figure 5A:
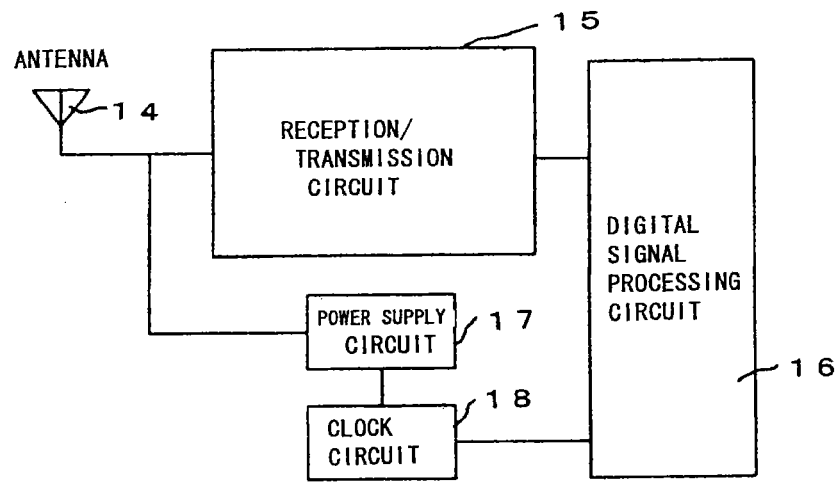
FIG. 5A shows a circuit configuration of an IC tag according to the embodiment of the present invention.

FIG. 5A is a block diagram showing an example of an IC tag circuit.

In the IC tag circuit, an antenna 14 and a smoothing capacitor in a rectification circuit (not shown) of a reception/transmission circuit 15 are primary passive devices that occupy an area. The reception/transmission circuit 15 has a radio-frequency (RF) circuit and an analog interface (IF), and transmits data to the outside from a digital signal processing circuit 16, or supplies external data. Collectively integrating all of these circuits is ideal, but the respective circuits are usually separated and realized as chips. It is to be noted that a clock circuit 17 is connected with the digital signal processing circuit 16, and a power supply circuit 18 is connected to the reception/transmission circuit 15 and the clock circuit 17.

Figure 5B:
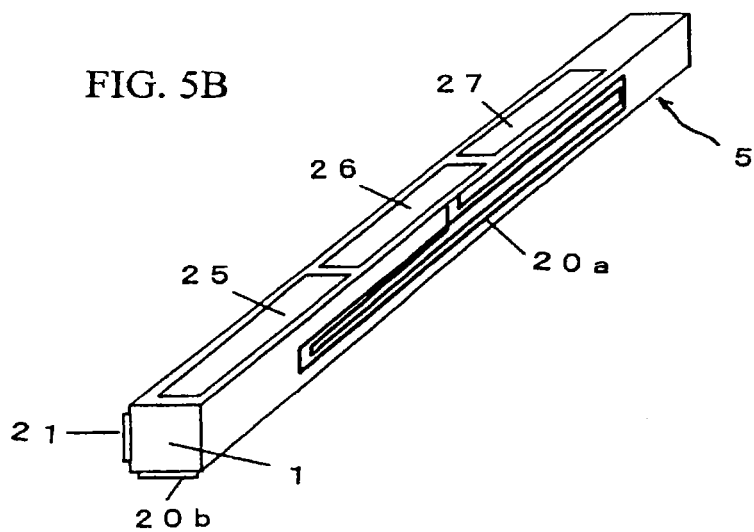
FIG. 5B is a perspective view showing an example of a layout on the fiber of the IC tag.

FIG. 5B is a perspective view schematically showing a layout of the IC tag formed by using the fiber SOI substrate.

Three types of circuits 25 to 27 as active circuits are separately formed on one surface of the fiber SOI substrate 5 having a square cross section, and two types of antennas or inductors 20a and 2b as passive devices are formed on another surface. A smoothing capacitor 21 as a passive device is formed on the remaining surface. As apparent from this structure, the respective passive devices and active devices are separated from each other and constituted on the complete insulating substrate, thereby providing high-performance functions.

Although the respective integrated circuits 25 to 27 are formed on the fiber SOI substrate 5 in this embodiment, the fiber 1 may be regarded as one type of printed-circuit board, and a separately manufactured silicon chip may be bonded to a structure comprising necessary passive devices or wiring formed thereon in advance to constitute the IC tag.

FIG. 6A shows a process flow of forming a transistor on the fiber, and FIG. 6B shows cross-sectional views of this formation process.

FIGS. 6A and 6B are views showing an example of a MOS transistor forming step when the fiber SOI substrate 5 is used. First, as indicated at a step (1-3) in FIGS. 6A and 6B, the silicon film 3 is patterned to form an island of the silicon film 3.

Then, as indicated at steps (4-6) and (7-10), a surface of the silicon film 3 is covered with a gate oxide film 9a by means of, e.g., a plasma oxidation, a thermal oxidation, or an oxide film formation to form a gate electrode 9b on the gate oxide film 9a. As a constituent material of the gate electrode 9b, a metal, e.g., tungsten or a tungsten silicide, or a metal silicide was used. Subsequently, as indicated at a step (11-17), impurity ion implantation is carried out on both sides of the gate electrode 9b to form a first impurity introducing region 3s and a second impurity introducing region 3d that constitute a source/drain (S/D).

Then, as indicated at steps (18-21) and (22-27), a first interlayer insulating film 9c is formed by, e.g., a thermal CVD method, and contact holes 9d to 9f are formed in the first interlayer insulating film 9c above the gate electrode 9b and the first and the second impurity introducing regions 3s and 3d by etching using a resist mask, thereby forming a gate wiring 9g, a source wiring 9i, and a drain wiring 9h. At this time, a barrier metal and titanium (Ti) were used as underlying layers of the wiring 9g, 9i, and 9h, and aluminum (Al) was used as a metal layer provided thereon.

Additionally, as indicated at steps (28-30) and (31-38), a second interlayer insulating film 9j is formed by, e.g., a thermal CVD method, then the second interlayer insulating film 9j is etched by using a resist mask to form respective through holes 9k, 9m, and 9n above the gate wiring 9g, the source wiring 9i, and the drain wiring 9h, and an aluminum film is formed on the second interlayer insulating film 9j and in the through holes 9k, 9m, and 9n. Thereafter, the aluminum film is etched by using a resist mask to form a plurality of second layer wiring 9p, 9r, and 9s that are individually connected with the gate electrode 9g, the source wiring 9i, and the drain wiring 9h via the through holes 9k, 9m, and 9n. The resist mask is removed after etching.

A reel-to-reel method is used to apply the above-explained MOS transistor manufacturing process on the fiber SOI substrate 5. The reel-to-reel method is a method of winding off the fiber from a reel to carry out a predetermined step and then again taking up the fiber around the reel to advance to the next step.

In the reel-to-reel method, all or a large part of a surface of the resist or the thin film must cover the fiber on the take-up stage. That is because a protection film is required to take up the fiber and, at the same time, this is a necessary condition to protect a formed pattern. A result of dividing the process depicted in FIG. 6 in accordance with this take-up principle is shown in a table of FIG. 7.

FIG. 7 shows a flow of forming the fiber SOI substrate as a one-dimensional substrate, a flow of forming the island of the silicon film, a flow of forming the gate electrode, a flow of forming the source/drain (S/D), a flow of forming the first interlayer insulating film/contact holes (a first layer PAS/CONT), a flow of forming the wiring of the gate and the drain/source (D/S), a flow of forming the second interlayer insulating film/through holes (a second layer PAS/CONT), and a flow of forming the second layer wiring.

As shown in this table, the mode of the device has three categories. A first category corresponds to a process that does not require a vacuum tank as a general rule, and is a process part having "○" (open circle) at a lower right in each block in FIG. 7. A second category is a process in the vacuum tank, it is a process where the reel is attached in the tank, and a process part having a mark "•" (filled circle) in each block in FIG. 7 corresponds this category. A third category is an exposure step, and it is a part having "Δ" (triangle) in each block in FIG. 7.

FIGS. 8 and 9 show device images of these three categories.

Figure 8A:
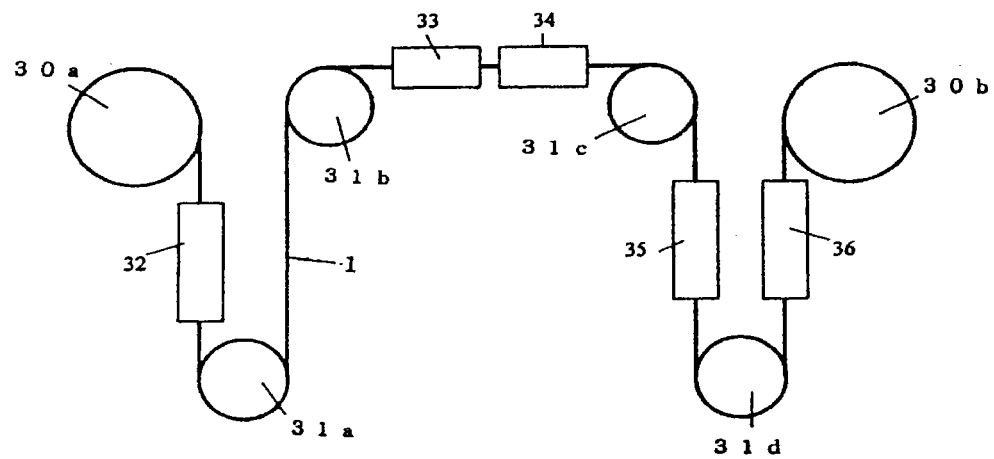
FIGS. 8A and 8B are block diagrams showing a principle of a device that realizes the reel-to-reel step in the embodiment according to the present invention.
Figure 8B:
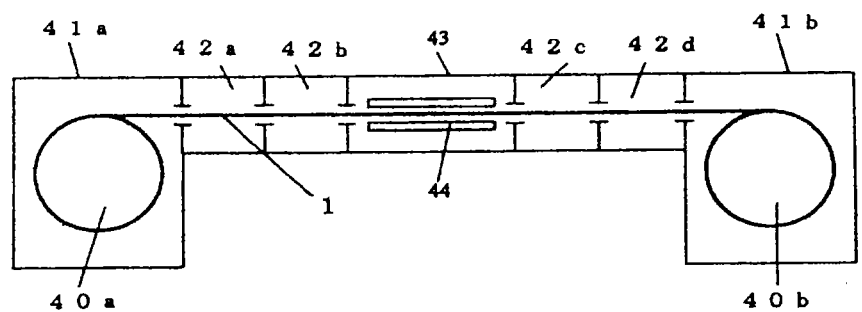

In FIG. 8A, the fiber 1 pulled out from a wind-off reel 30a passes through various kinds of process devices 32 to 36, and finally taken up by a take-up reel 30b. A moving direction of the fiber 1 is changed by different reels 31a to 31d or the like depending on steps and device configurations in the respective process devices 32 to 36. On the other hand, when the vacuum tank is used, as shown in FIG. 8B, reels 40a and 40b arranged in front of and at the rear of a process chamber 43 perform wind-off and take-up operations in vacuum tanks 41a and 41b. A sputtering electrode and a dry-etching electrode or ion gun constituent component 44 are arranged in the process chamber 43.

The fiber 1 is essentially configured to linearly travel without changing its direction. As steps adopting this mode, there are film formation, dry etching, and implantation. The film formation step includes steps of ashing a resist applied before film formation in the vacuum tank and completely removing the resist by using, e.g., ultraviolet ray irradiation. The resist in this example is just a protection film, and a material that can be readily removed is selected. The dry etching and implantation steps include a step of removing a hardened part of the resist that is generated in the process. As explained above, the fiber 1 continuously passes through several stages using different operation gases, and hence the different tanks must be separated from each other by using, e.g., differential exhaust.

In FIG. 8B, the differential exhaust chamber, the dry peeling chamber, and the ashing chamber 42a to 42d around the process chamber 43 for, e.g., film formation, ion implantation, or dry etching correspond to these tanks. A diameter of the reel 40b is determined as 300 mm or above when winding the fiber 1 comprising the resist applied thereto around the reel 40b, and a diameter of the reel 40b is determined as 600 mm or above when winding the fiber 1 comprising a metal or $SiO_2$ formed thereon.

Since the resist exposure step requires a high accuracy, an independent reel-to-reel operation is carried out. FIG. 9 show a concept of an exposure device used in the present invention.

Figure 9A:
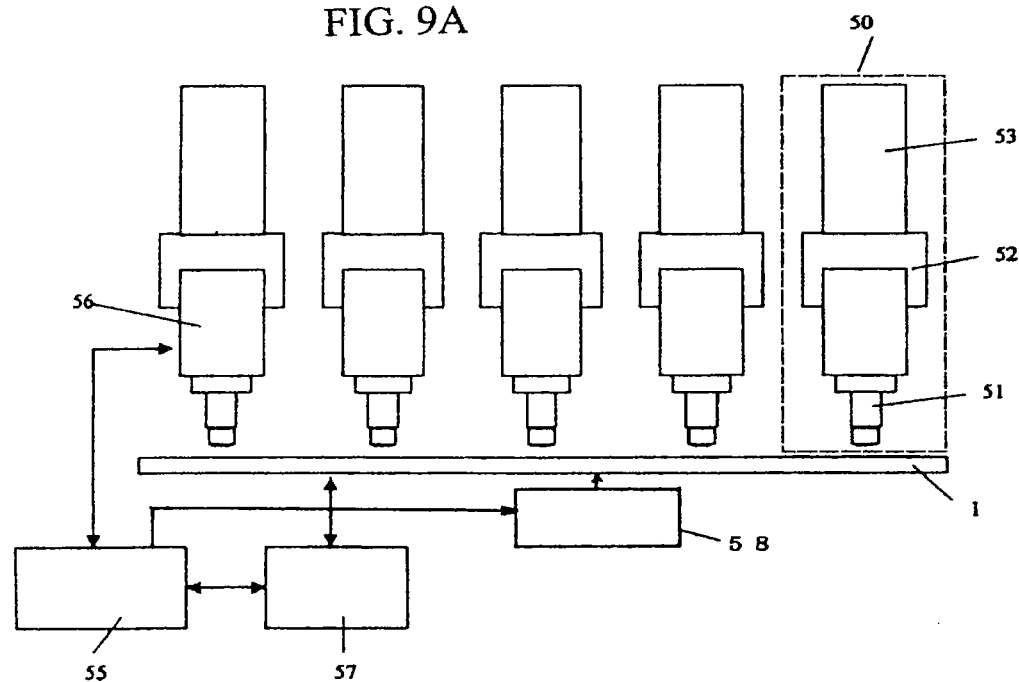
FIGS. 9A and 9B are views showing a principle of an optical system and a servo control system in a fiber substrate exposure device used in the embodiment according to the present invention.

FIG. 9A is a principle view in which miniaturized reduced projection exposure optical systems 50 are linearly aligned on the fiber 1.

In the reduced projection exposure optical system 50, an image forming lens 51 has a size that is comparable to an object lens in a microscope, and reduced projection is carried out by using an exposure mask 52 illuminated by a Koehler illumination optical system 53 on the fiber 1 at a ratio of 5:1.

In regard to an alignment of the fiber 1, a signal from a detection system 57 that detects, e.g., a position or linearity of the fiber 1 is processed by a servo control computer 55, and an obtained result is fed back to each of an individual image forming lens control system 56 and a fiber control system 58.

Figure 9B:
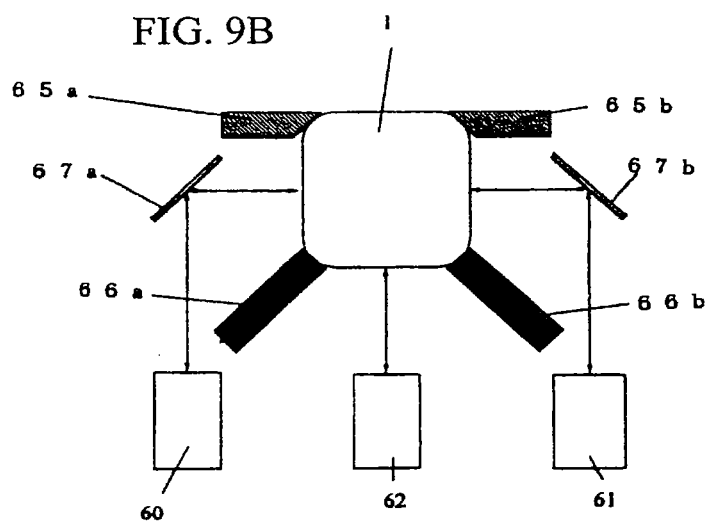
Figure 10A:
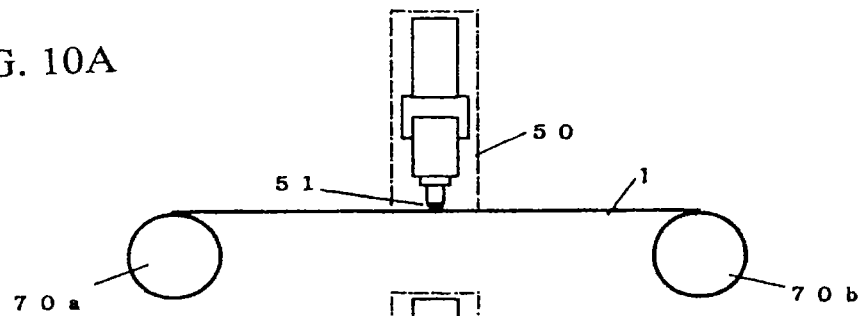
FIGS. 10A to 10D are views showing aspects of exposure of four sides of a fiber having an angular cross-sectional shape.
Figure 10B:
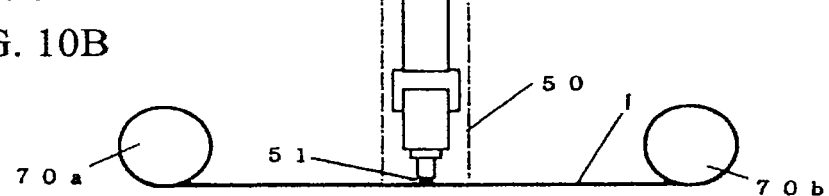
Figure 10C:
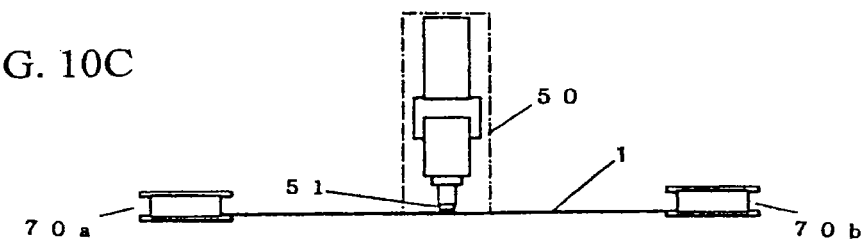
Figure 10D:
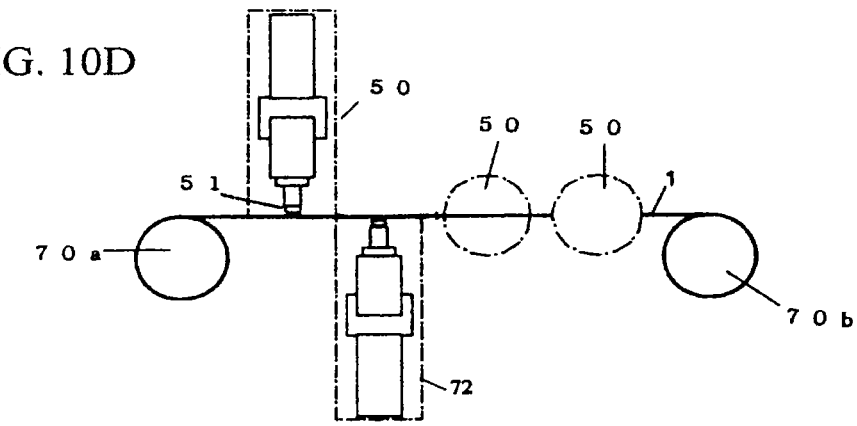

FIG. 9B shows a concept of an alignment system of the fiber 1. In regard to an alignment diameter, three surfaces of the fiber 1 except an exposure surface are used to detect a position and an angle of the fiber 1 by fiber surface position detection optical systems 60 to 62 and mirrors 67a and 67b, and an obtained result is used to control positions of fiber servo mechanical control systems 65a, 65b, 66a, and 66b through the fiber control system 58, thereby positioning the fiber 1. At an alignment/exposure step, the fiber 1 is in a still state, and the fiber 1 is fed stepwise at the exposure step.

As shown in FIG. 10, exposure of each of four surfaces of the angular fiber 1 is readily carried out by changing how to place the exposure device and the reels. FIG. 10A shows a state where respective wind-off and take-up reels 70a and 70b are arranged in such a manner that the upper surface of the fiber 1 faces a coupling lens 51 of the exposure optical system 50, FIG. 10B shows a state where the respective reels 70a and 70b are arranged in such a manner that the lower surface of the fiber 1 faces the coupling lens 51, and FIG. 10C shows a state where the respective reels 70a and 70b are arranged in such a manner that the side surface adjacent to the upper surface of the fiber 1 faces the coupling lens 51. Further, in FIG. 10D, positions of the respective reels 70a and 70b are fixed and arranged in a state where the coupling lenses 51 of the plurality of exposure optical systems 50 face the respective surfaces of the fiber 1. That is, the plurality of exposure optical systems 50 are arranged in four directions around the fiber 1 while changing their directions in such a manner that their coupling lenses 51 face the different surfaces of the fiber 1. In this case, the plurality of exposure optical systems 50 may be arranged in longitudinal directions of the respective surfaces.

A production throughput based on a standard investment for a current semiconductor production line is 9,000 sheets/month when using a semiconductor wafer of 200 mmφ (a diameter of 200 mm), and the latest large-scale investment may involve a plan of 20,000 sheets/month when using a semiconductor wafer of 300 mmφ.

A tact time of the former case is 200 seconds/wafer, and that of the latter case is 90 seconds/wafer. In this embodiment, the angular fiber 1 having a width of 0.3 mm is used, and an effective width of one side of this fiber is 0.2 mm.

According to a first example of the exposure device, the fiber 1 is associated with a semiconductor wafer of 200 mmφ (a diameter of eight inches). That is, a fiber length corresponding to this semiconductor wafer is 157 m and, when exposure is performed in units of 50 cm in FIG. 9A, 314 exposure/alignment operations are carried out in 200 seconds, namely, a single exposure/alignment time is 0.6 second. A single exposure/alignment time of a current standard excimer stepper is approximately one second, an exposure time within this period is 0.1 to 0.3 second, and an alignment time within the same is 0.9 to 0.7 second. It is to be noted that a mechanical alignment time of a one-dimensional fiber is set to 0.5 second and an exposure time of the same is set to 0.1 second. In regard to the exposure optical system, the current excimer exposure device is modified into the conformation depicted in FIG. 9A.

A second example concerning the exposure device corresponds to a semiconductor wafer of 300 mmφ (a diameter of 12 inches), a fiber length in this example is approximately 350 m and, when exposure is performed in units of 50 cm in FIG. 9A, 700 exposure/alignment operations are carried out in 90 seconds, namely, a single exposure/alignment time is approximately 0.1 second. Therefore, the single exposure/alignment time of the current standard excimer stepper is reduced by a single digit, but setting a mechanical alignment time to 70 ms can be sufficiently realized while making reference to high-speed servo control of, e.g., a DVD in a one-dimensional fiber.

On the other hand, an exposure time has an aspect of a dose amount and another aspect of realization of incoherence. In a wafer excimer standard device, a dose amount is 10 mJ/1 shot with respect to an exposure area of 25 mm×25 mm, namely, 100 shots at minimum, and hence a necessary energy density is 160 mJ/cm$^2$. Since an oscillation frequency is 1 kHz when the exposure time is set to 10 to 30 ms, 10 to 30 shots are obtained, namely, a dose amount per shot is 16 to 5 mJ/cm$^2$, and hence there is no problem.

The only problem lines in whether 10 to 30 shots are sufficient as realization of incoherence. FIG. 11 show a mode of reducing a coherence of illumination light of excimer light to cope with this problem.

Figure 11A:
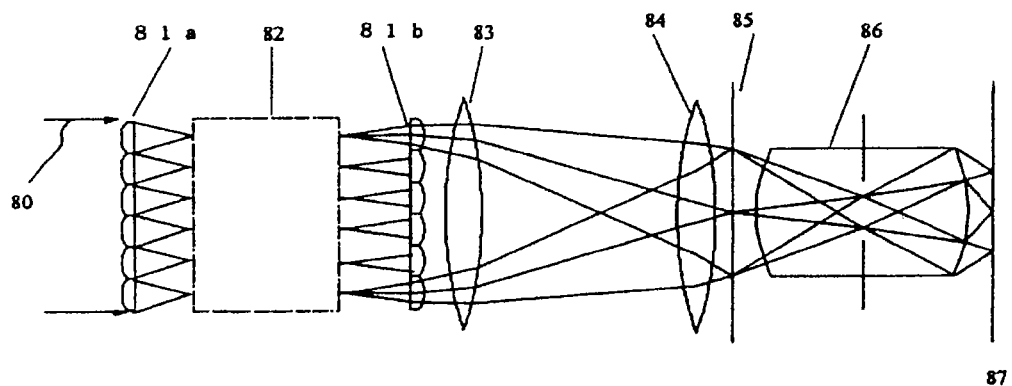
FIGS. 11A and 11B are a principle view of an exposure optical system and a block diagram showing a method of realizing incoherence of illumination light in the embodiment according to the present invention.
Figure 11B:
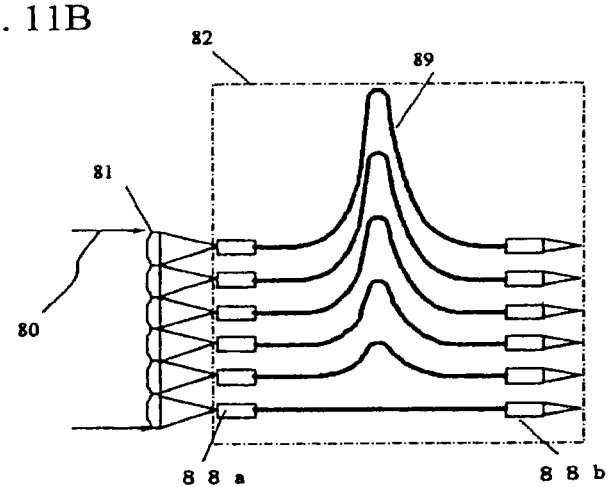

FIG. 11A is a principle view of an exposure optical system. Light 80 from a light source is changed into a secondary light source by a first split lens 81a, transmitted through an incoherence realizing section 82, and uniformly illuminates an exposure mask 85 by using a second split lens 81b and a condenser lens 83. Furthermore, a field lens 84 and an image forming lens 86 that are arranged in front of and at the rear of the exposure mask 85 Fourier-transform a mask pattern twice, thereby obtaining an image formed on an image forming plane 87. In regard to an operation of realizing incoherence in the incoherence realizing section 82, each divided light is led to one end of each of optical path difference optical fibers 89 having various lengths longer than a coherent length through each incidence-side lens 88a in the middle of split lenses 81a and 81b, and each light exits from the other end of each optical path difference optical fiber 89 through each exit-side lens 88b to be matched with the split lens 81b as shown in FIG. 11B. As a result, incoherent illumination can be obtained from one shot in principle.

In the above-explained two examples of the exposure device, an effective exposure region of the image forming lens 51 is 1 mm×5 mm, a NA (numerical aperture) is 0.42, and a resolution is 0.3 μm. The number of the reduced projection exposure optical systems 50 is 17, and these systems are arranged with a pitch of 30 mm to collectively expose 500 mm.

Since a circuit of the IC tag can be arranged in a region of 1 mm$^2$ in a design of a wafer surface, an effective width is 0.2 mm and a length is 5 mm when producing this circuit on the fiber 1 having a 0.3 mm square cross section. In this case, considering an arrangement of the antenna 20 and others depicted in FIG. 5B, a size of the IC tag becomes 30 mm, but a pitch of the image forming lenses 51 of the reduced projection exposure optical systems 50 is increased when the size is longer than the above-explained value, and the number of the image forming lenses 51 is reduced in some cases to perform exposure. When the size of the IC tag is short, positions between the image forming lenses 51 are adjusted to become integral multiples of the length of the IC tag, and exposure is carried out while shifting the lenses for this length.

In regard to the entire process, according to this embodiment, the process conforming to the number of eight-inch wafers explained in the first example of the exposure device, i.e., 9,000 sheets/month was planed. Although the fiber 1 is fed stepwise at the exposure step thereof, other steps than this exposure step are processes of traveling at a constant speed as a general rule. Although a magnitude of a traveling speed is 15,700 cm/200=79 cm/s, it is determined as 1 m/s while considering replacement of the reels and others.

A table depicted in FIG. 12 shows a comparison between various process rates when a current flat substrate and the fiber SOI substrate according to this embodiment are used.

Figure 13:
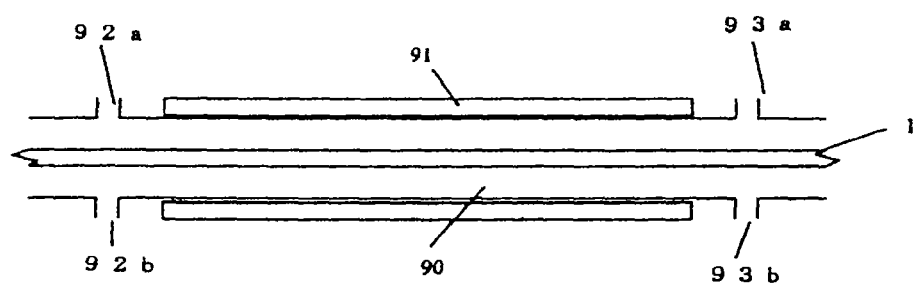
FIG. 13 is a block diagram showing a principle of a thermal CVD apparatus used in the embodiment according to the present invention.

Such a thermal CVD device as shown in FIG. 13 is used for growth of films, e.g., a silicon oxide film or a silicon nitride film in the fiber.

In FIG. 13, a film forming chamber 90 formed of a quartz tube whose pressure is decreased by exhaust is heated to a high temperature by using a heater 91 arranged at an outer periphery, and a film forming gas is introduced into the quartz tube 90 through gas introducing openings 92a and 92b and discharged from an exhaust openings 93a and 93b arranged with a predetermined distance from the gas introducing openings 91a and 92b to decrease a pressure, thereby forming a film on a surface of the fiber 1. A region from the gas introducing openings 91a and 91b to the exhaust openings 93a and 93b, i.e., a length of a film formation effective section is, e.g., 1 m. Such a thermal CVD device corresponds to, e.g., the process chamber 43 depicted in FIG. 8B.

Figure 14A:
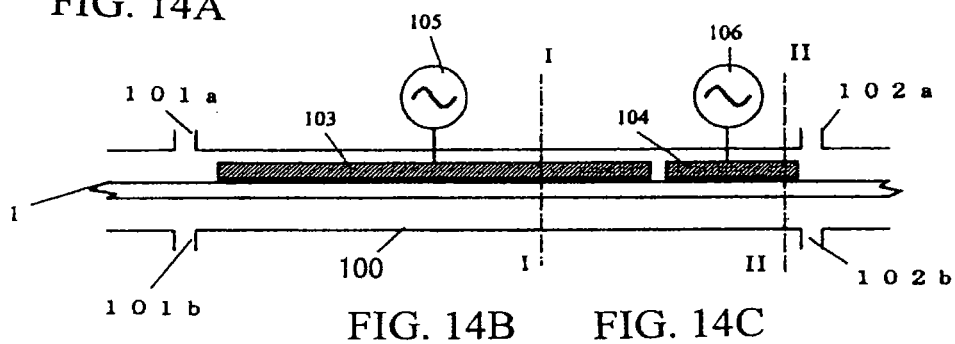
FIG. 14A is a block diagram showing a principle of a dry etching device used in the embodiment according to the present invention.

When etching the film or the fiber SOI device, such a reactive ion etching (RIE) device as shown in FIG. 14 is used.

In FIG. 14, the RIE device introduces an etching gas into a tubular dry etching chamber 100 through gas introducing openings 101a and 101b with a pressure that is substantially equal to an atmospheric pressure, and performs exhaust through exhaust openings 102a and 102b provided to the reaction tube 100 with a predetermined distance from the gas introducing openings 101a and 101b, thereby reducing the pressure. As a result, a density plasma is generated in the reaction tube 100. Moreover, powers from high-frequency power supplies 105 and 106 are applied to linear electrodes 103 and 104 that are arranged in proximity to and in parallel with the fiber 1 in the reaction tube 100, thus increasing an etching rate based on electric field concentration.

Figure 14B:
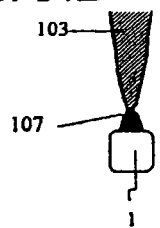
FIGS. 14B and 14C are cross-sectional views showing a fiber and an electrode in the dry etching device.
Figure 14C:
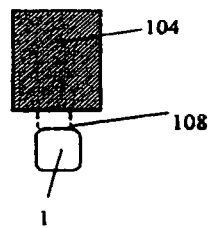

The linear electrodes 103 and 104 are separated from each other in a gas flow direction and adjacent to each other with a gap interposed therebetween. As shown in FIG. 14B that is a cross-sectional view taken along a line I-I in FIG. 14A, in one linear electrode 103 on an upstream side of a reactive gas flow path, its part close to the fiber 1 has an acute shape, and an electric field 107 can be thereby concentrated on the fiber 1 to increase the etching rate, thus effecting etching. Additionally, in a state where the film is etched to a large degree below the linear electrode 103, when the fiber 1 is fed to a region of the other linear electrode 104 on a downstream side of the reactive gas flow path, as shown in FIG. 14C that is a cross-sectional view taken along a line II-II in FIG. 14A, a density of an electric field 108 can be reduced, and weak etching with less damage is carried out. A part of the downstream-side linear electrode 104 facing the fiber 1 is, e.g., flat. A length of an effective part of the upstream-side linear electrode 103 is, e.g., 1 m, and a length of an effective part of the downstream-side linear electrode 104 is 0.5 m. Such a RIE device corresponds to, e.g., the process chamber 43 shown in FIG. 8B.

A metal film of, e.g., aluminum (Al) or tungsten (W) is formed on the fiber 1 by ion plating. In the ion plating mode on the current flat semiconductor substrate, when a vapor deposition source having an opening of 30 mmϕ is used to form a film on the surface of 1 m$^2$, a film thickness of 150 nm can be obtained on the substrate at a moving speed of 1 m/minute. Therefore, 3.6 μm/s can be achieved near the opening of the vapor deposition source. In this embodiment, when the opening of the vapor deposition source is formed to have a linear shape of 4×170 mm and the two opening are linearly arranged, a necessary film thickness can be obtained.

In film formation other than a metal film formation and dry etching, since a film forming rate and an etching rate are insufficient, ten fibers are processed in parallel. In case of a reel diameter of 500 mmϕ, one wafer corresponds to 100 turns, a reel width is 30 mm, and the reels themselves can be accommodated in a container having a width of 500 mm even if 10 reels are arranged. Further, since the fibers 1 are collected to have a width of approximately 10 mm in the process region. Usually, 25 sheets are wound around one reel along the lines of a semiconductor. Activation annealing and H$_2$ annealing after ion implantation cannot be performed in the reel-to-reel scheme. As shown in FIG. 7, both types of annealing are performed as batch processing steps. In particular, since activation annealing is effected at a high temperature for a long time, each sheet is wound around a quartz or ceramics reel.

Figure 15A:
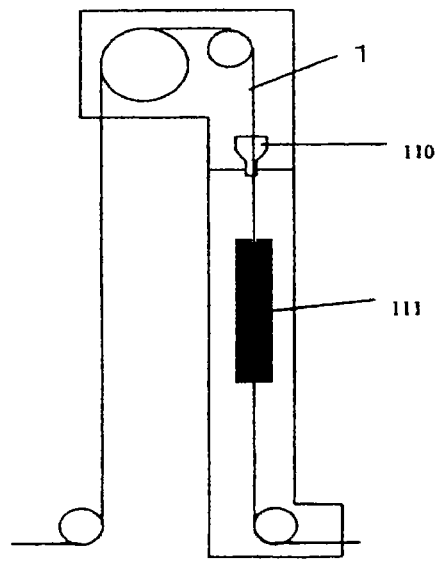
FIG. 15A is a block diagram of a resist application device used in the embodiment according to the present invention.
Figure 15B:
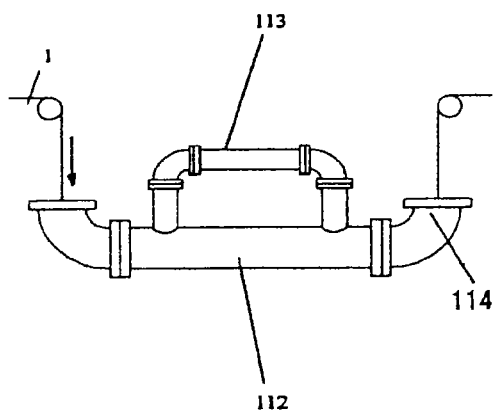
FIG. 15B is a block diagram showing a wet process device used in the embodiment according to the present invention.

A wet step is classified into three types, i.e., resist application/pre-baking, development/cleaning/drying, and peeling/cleaning/drying. Resist application/pre-baking is a step similar to protection film application in the optical fiber drawing step since the fiber 1 is continuously fed to a resist coating section 110 and a pre-baking furnace 111 as shown in FIG. 15A. Development, cleaning, and peeling typically have a style of introducing the fiber 1 into a liquid tank 112 as shown in FIG. 15B. A liquid is circulated, replaced, and temperature-adjusted by a bypass section 113, and constantly controlled to satisfy fixed conditions. Drying is IPA drying using steam of isopropyl alcohol (IPA), adopts the same configuration as that depicted in FIG. 15B, but has a steam phase of IPA at an exit 114.

Such a 2.45 GHz high-frequency semiconductor device (REID) as shown in FIG. 5 was manufactured by using the above-explained process. The fiber 1 has an angular shape with a width of 0.3 mm and a length of 60 mm, a rod-like antenna 20a (14) is formed on one surface thereof, circuits 25 to 27 each having a SOI configuration are formed on another adjacent surface, and a digital signal processing circuit 16 including a rectification circuit, a RF section, and EEPROM is formed here. A 600 pF capacitor 21 for a power supply is formed on still another surface adjacent to the surface having the SOI configuration formed thereon on a rear side of the antenna 20a.

It is to be noted that the fiber having a square cross section is used in the foregoing embodiment, but a fiber having a polygonal cross section, e.g., a triangular or a pentagonal cross section may be used.

INDUSTRIAL APPLICABILITY

The present invention can utilize all kinds of semiconductor devices each using a SOI substrate at a low price, and also enables use of a quartz fiber as a PCB.

What is claimed is:

1. A manufacturing method of a fiber SOI substrate comprising:
   a step of forming an amorphous, micro-crystal, or poly-crystal semiconductor thin film on at least one surface of a fiber having a polygonal cross section;
   a step of crystallizing the semiconductor thin film by using one of a thermal annealing and a laser annealing;
   a step of forming on the surface of the fiber a plurality of grooves that extend in a linear direction of the fiber and are arranged at intervals in a width direction before forming the semiconductor thin film;
   a step of previously forming a plurality of initial grooves on a surface of a base material that is used to form the fiber;
   a step of forming the fiber by fiber drawing of the base material and, at the same time, narrowing the initial grooves of the fiber to have a predetermined width, thereby providing the grooves of the fiber and
   a step of forming an insulative or a semiconductor thin film on the surface of the fiber comprising the grooves before crystallizing the semiconductor thin film.

2. The manufacturing method of the fiber SOI substrate according to claim 1, further comprising a step of forming a silicon dioxide film on the semiconductor thin film after crystallizing the semiconductor thin film.

3. The manufacturing method of the fiber SOI substrate according to claim 2, wherein the step of forming the silicon dioxide film is a step of forming a thermally oxidized film in a thermal oxidation furnace, continuously forming a film of a vapor-phase grown silicon dioxide, and annealing the film at a high temperature.

* * * * *